United States Patent [19]
Jeffers et al.

[11] Patent Number: 5,644,228
[45] Date of Patent: *Jul. 1, 1997

[54] PERMANENT MAGNET ASSEMBLY WITH MR AND DC COMPENSATING BIAS

[75] Inventors: Frederick John Jeffers, Escondido; Neil Smith, San Diego; Jay Davis Freeman, Leucadia; Kent Raphael Gandola, Poway; Peter VanderSalm Koeppe, San Diego, all of Calif.

[73] Assignee: Eastman Kodak Company, Rochester, N.Y.

[*] Notice: The term of this patent shall not extend beyond the expiration date of Pat. No. 5,418,458.

[21] Appl. No.: 330,506

[22] Filed: Oct. 28, 1994

Related U.S. Application Data

[63] Continuation-in-part of Ser. No. 114,720, Aug. 31, 1993, Pat. No. 5,418,458.

[51] Int. Cl.$^6$ .............................. G01N 27/90; G06K 7/08
[52] U.S. Cl. ............................................ 324/235; 235/449
[58] Field of Search ........................... 324/207.12, 207.2, 324/207.21, 252, 251, 225, 235; 338/32 R, 32 H; 235/449

[56] References Cited

U.S. PATENT DOCUMENTS

| | | |
|---|---|---|
| 3,796,859 | 3/1974 | Thompson . |
| 3,979,775 | 9/1976 | Schwartz . |
| 4,401,944 | 8/1983 | Narimatsu et al. ............... 324/207.21 |
| 4,492,922 | 1/1985 | Ohkubo ............................ 324/207.21 |
| 4,523,243 | 6/1985 | Billington . |
| 4,603,365 | 7/1986 | Nakamura ........................ 324/225 X |
| 4,703,378 | 10/1987 | Imakoshi et al. ..................... 360/113 |
| 4,734,644 | 3/1988 | Imakoshi et al. ..................... 324/252 |
| 5,081,554 | 1/1992 | Das ........................................ 360/113 |
| 5,159,511 | 10/1992 | Das . |
| 5,351,158 | 9/1994 | Shibata ................................. 360/113 |
| 5,418,458 | 5/1995 | Jeffers .................................. 324/235 |
| 5,436,778 | 7/1995 | Lin et al. ............................. 360/113 |
| 5,450,009 | 9/1995 | Murakami ........................ 324/207.21 |

*Primary Examiner*—Sandra L. O'Shea
*Assistant Examiner*—Roger C. Phillips
*Attorney, Agent, or Firm*—William F. Noval

[57] ABSTRACT

A magnetic assembly for detection and authentication of magnetic documents. The magnetic assembly includes a permanent magnet (PM), first and second magnetically soft high permeability pole pieces shaped to form a tapered, variable gap size magnetic circuit with the permanent magnet. The PM is located at a first gap between the first and second pole pieces. A magnetoresistive (MR) sensing element is located at or near the center of a second gap between said first and second pole pieces. The second gap and MR sensing element are proximate a magnetic document to be sensed. An electrical conductor is adjacent to the MR sensing element, but is electrically insulated therefrom. A direct current is passed through the electrical conductor to create a compensating bias field in the MR element which is combined with the bias field generated by the PM.

6 Claims, 2 Drawing Sheets

PERMANENT MAGNET ASSEMBLY WITH MR AND DC COMPENSATING BIAS

CROSS-REFERENCE TO RELATED APPLICATION

This application is a continuation-in-part of and claims the priority under 35 USC 120 of U.S. patent application Ser. No. 08/114,720, filed Aug. 31, 1993 now U.S. Pat. No. 5,418,458, issued May 23, 1995.

FIELD OF INVENTION

This invention relates generally to the detection of magnetic fields and, more particularly to the detection of magnetic fields emanating from documents having a magnetic layer such as magnetic ink through the use of a permanent magnet biased magnetoresistive (MR) element.

BACKGROUND OF THE INVENTION

In this application, the term "document" is used to refer to any valuable sheet of paper or other body having a magnetic layer such as ink containing a magnetic pigment having specified magnetic properties.

A magnetoresistive sensing element responds to a signal recorded on a magnetic medium through variation of resistance of the magnetoresistive element which intercepts the signal flux emanating from the medium. The theoretical variation in resistance for a single domain film is a parabolic function of the magnetic field strength applied to the element. Referring to FIG. 1, the ordinate of curve 10 represents the fractional change of the resistance of a typical single domain NiFe permalloy thin film magnetoresistive element as a function of magnetic field strength, H. Because of demagnetizing fields in the layer, the curve 10 deviates in the regions 12 from the "simple" parabolic response represented by dotted segments 14.

Typically, the operating point 17 of the magnetoresistive element is set to provide maximum output signal and minimum second harmonic distortion. This point occurs at the point of inflection 16 of the curve 10 in a uniform signal field. In practice, several factors cause the definition of the optimum point to be more complex, and it must generally be determined either theoretically or experimentally in a given application. A constant bias field Hb 18 applied to the magnetoresistive element establishes the operating point 17, and a varying input signal field Hs 20 applied about the operating point 17 results in an output resistance variation 22 which replicates the input signal Hs 20. The corresponding voltage drop resulting from a sense current 23 flowing through the MR element provides a voltage output.

Generally, the bias field can be produced by one of several techniques, such as by a permanent magnet, by a shunt bias, by a soft adjacent layer, by a barber pole MR configuration, or the like. Permanent magnet bias is advantageous in not requiring the use of circuitry and components external to the MR assembly to effect a large bias. Shunt bias is disclosed in the following U.S. Patents: U.S. Pat. No. 4,523,243, issued Jun. 11, 1985, inventor Billington; U.S. Pat. No. 5,159,511, issued Oct. 27, 1992, inventor Das.

A need exists for a magnetic assembly which is capable of sensing the saturation magnetic field in a magnetic layer of a document simultaneously with its production. Because the magnetic quality of magnetic ink pigment is likely to be poor, with low coercivity and low remanent magnetization, it is desirable to have the ability to make in-field measurements of the documents, i.e., to read their characteristic magnetic signal with an MR sensor element while the document is being simultaneously magnetized with an external magnetic field sufficiently large to partially or fully saturate the magnetic pigment in the ink of the document. It is also desirable that such a magnetic assembly reduce the reverse magnetic field seen by a document either before or after passing the MR sensor element.

U.S. Pat. No. 3,796,859, issued Mar. 12, 1974, inventor Thompson, discloses a magnetic ink reading system including a U-shaped permanent magnet recording head for magnetizing magnetic ink on a document. A magnetoresistive (MR) sensing element is located within the yoke of the permanent magnet. The MR sensing element both is biased by the permanent magnet and senses the magnetized ink simultaneously with its production. The system disclosed in this patent is disadvantageous because the yoke ends of the permanent magnet are located close to the magnetized ink of a document and tend to demagnetize the ink before it can be sensed by a magnetic read assembly downstream from the magnetic head. The U-shaped permanent magnet can also be expensive and difficult to configure for a given application.

In copending U.S. patent application Ser. No. 08/114,720, filed Aug. 31, 1993 now U.S. Pat. No. 5,418,458, issued May 23, 1995, a magnetic assembly is provided for detecting and authenticating magnetic documents which provides sufficient magnetic field to partially and/or fully saturate the magnetic layer (ink) of a document which is simultaneously magnetically sensed for purposes of identification or authentication. The magnetic assembly is simple, has high intrinsic sensitivity, has a signal output with high signal-to-noise ratio, has a signal output which is independent of the speed of a magnetic document passing the assembly, and has minimal power dissipation and heating. The magnetic assembly for both magnetizing and detecting magnetic documents comprises a permanent magnet; first and second magnetically soft, high permeability pole pieces shaped to form a tapered variable gap-size magnetic circuit with said permanent magnet, wherein said permanent magnet is located at a first gap between said first and second pole pieces; a magnetoresistive (MR) sensing element which is located at or near the center of a second gap between said first and second pole pieces, wherein said second gap and said MR sensing element are proximate to a magnetic document to be sensed by said MR sensing element; and wherein said magnetic field at said MR sensing element maintains said MR element in a proper magnetic bias state for achieving adequate sensitivity for detecting magnetic fields emanating from a magnetic document to be sensed.

In the magnetic assembly disclosed in U.S. patent application Ser. No. 08/114,720, the hard axis or transverse bias field of the MR sensing element needs to be 15 Oe±2 Oe, while the field from the permanent magnet and pole pieces is as large as 1000 Oe. Because of mechanical tolerance and stray field problems, it was found to be very difficult to assemble the permanent magnet, pole pieces, MR sensing element(s) and supporting structure (housings) so as to achieve optimum bias on the MR sensing element. U.S. Pat. No. 3,979,775, issued Sep. 7, 1976, inventor Schwartz, discloses a compensation technique for thermal drift and bias balancing in a magnetoresistive multitransducer assembly. The disclosed technique is complex and not suitable to solving the aforementioned problem.

SUMMARY OF THE INVENTION

According to the present invention, there is provided a solution to the problems of the prior art by incorporating a magnetic assembly comprising a magnetoresistive (MR) element for sensing a magnetic field from a magnetic object; a permanent magnet for generating a bias field in said MR element which creates a magnetic bias state for achieving close to optimum sensitivity for detecting the magnetic field emanating from said magnetic object; an electrical conductor which is adjacent to but electrically insulated from said MR element; and a variable source of direct current for passing direct current through said electrical conductor for generating a bias field in said MR element which is combined with said bias field generated by said permanent magnet, wherein said bias field generated by said permanent magnet is substantially larger than said bias field generated by said direct current.

DETAILED DESCRIPTION OF THE INVENTION

Figure 1:
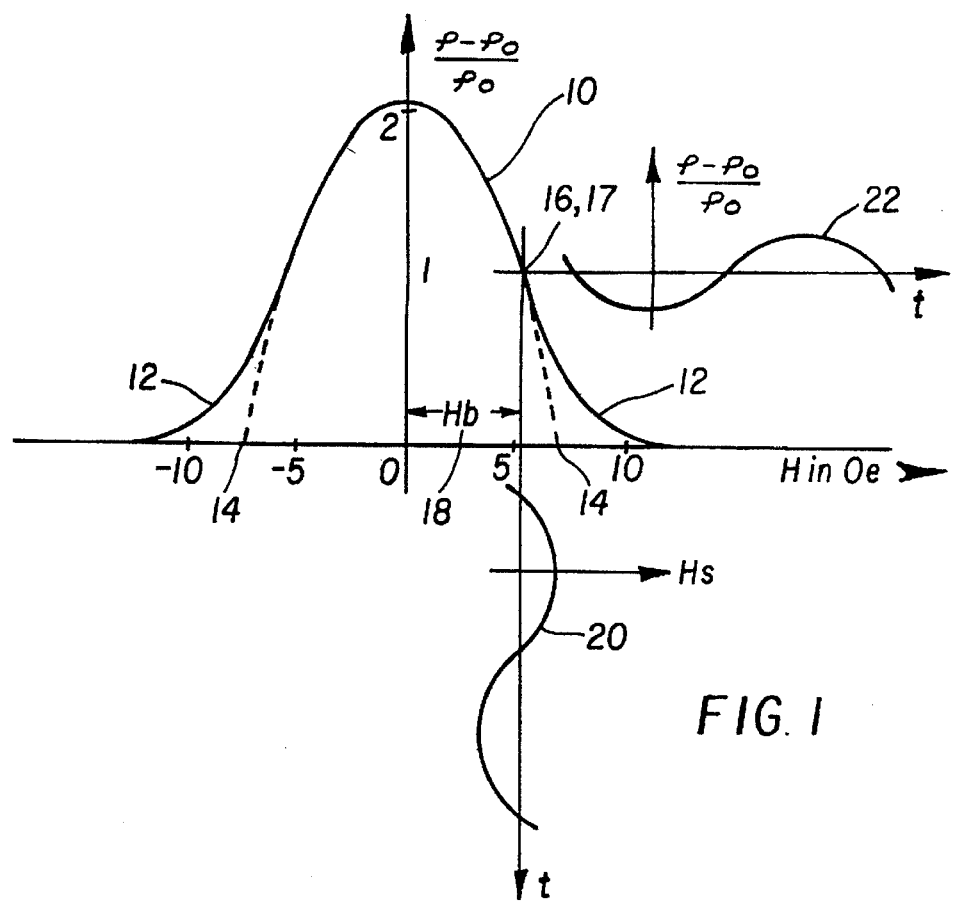
FIG. 1 is a graph of magnetoresistance as a function of applied magnetic field.
Figure 2:
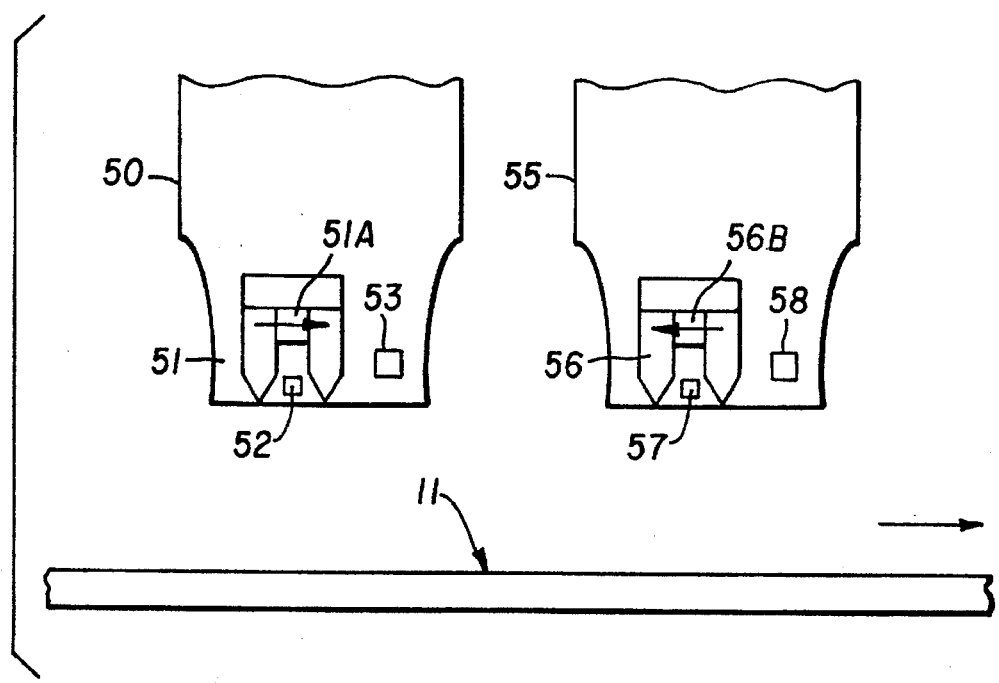
FIG. 2 is a diagrammatic view of a magnetic head array incorporating the present invention.

Referring to FIG. 2, the general configuration for a magnetic head array incorporating the present invention is shown. A first magnetic assembly 50 includes elements 51 for producing a saturation magnetic field, a MR sensor 52 in the gap of elements 51 for detecting the saturation magnetic moment induced in a magnetic object. A secondary sensor 53 for detecting the remanent moment in the magnetic object may also be provided. The elements 51 include a permanent magnet 51A between soft magnetic material yokes. A second magnetic assembly 55 includes elements 56 for providing a non-saturating magnetic field in a direction opposite direction to that of the field of the first magnetic assembly, a MR sensor 57 located in the gap of the field producing elements 56 for detecting the non-saturating magnetic moment induced in said magnetic object. A sensor 58 for detecting the remanence moment of the magnetic object may also be provided. The elements 56 include a permanent magnet 56A between soft magnetic material yokes. The extra sensors 53 and 58 of FIG. 2 can provide additional information to aid in the authentication of a document.

The sensing principle of detectors 52 and 57 is that of magnetoresistance. Thin films of 81/19 NiFe are located in the gaps of structures 51 and 56 so that the plane of the films are perpendicular to the large magnetic field at those points. Because the plane of the film is perpendicular to the large field, this field is not detected and the sensors can respond to the very small magnetic field emanating from the Notes with excellent signal to noise ratio. The other sensors 53 and 58 of FIG. 2 are also preferably magneto-resistive sensors in the preferred embodiment.

Figure 3:
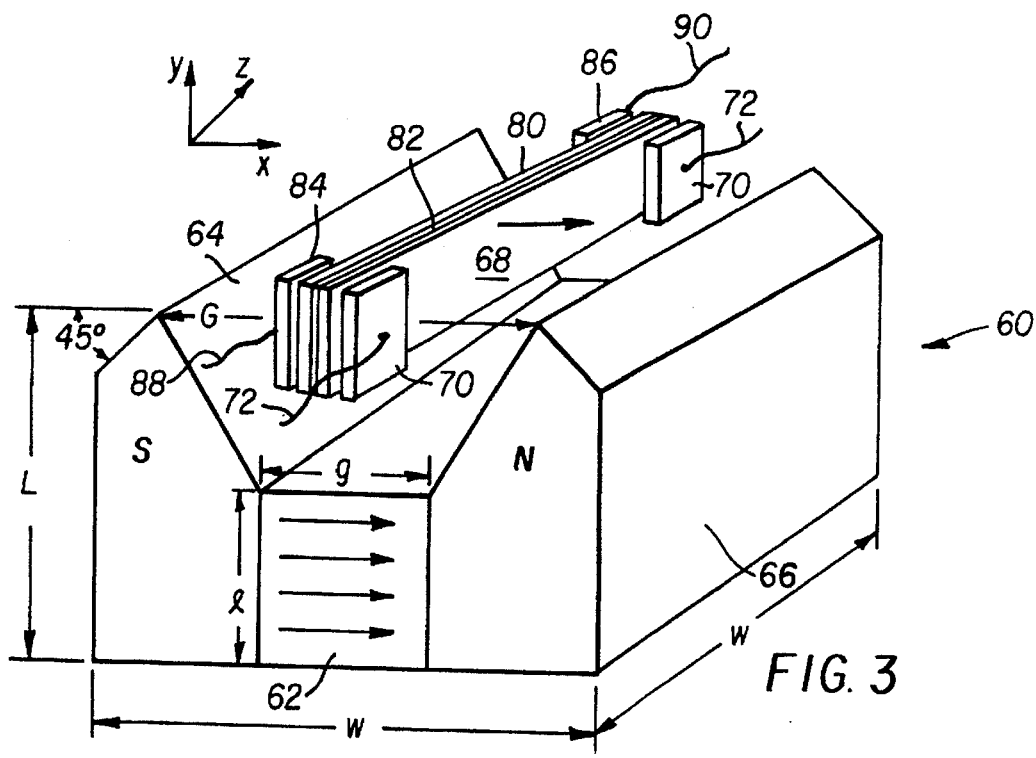
FIG. 3 is a diagrammatic perspective view of a magnetic assembly incorporating the invention.

A preferred embodiment of the magnetic assembly according to the present invention is shown in FIG. 3. As shown, magnetic assembly 60 includes a permanent magnet 62, magnetically soft, high permeability pole pieces 64,66 and magnetoresistive (MR) sensing element 68 located at or near the center of first gap G between pole pieces 64,66. Element 68 has conductive pads 70 and conductors 72 for carrying an electrical sensing current through sensing element 68.

The size of the first gap, G, is chosen such that the gap field, $H_G$, (along the x-direction) is sufficiently large, and the gradient, $\partial H_x/\partial y$, is sufficiently small, in order to substantially or fully magnetically saturate the magnetic component of the pigment (ink) of the document being read, over the full mechanical tolerance of the head-to-document spacing of the mechanical transport which moves a document past the MR sensing element 68 located at or near the center of the first gap, G. The second gap, g, at the site of the permanent magnet (PM) 62, and equal to the thickness of the PM 62, is chosen so that the PM 62 will provide sufficient magnetomotive force to achieve sufficient magnitude of the gap field, $H_G$. Along with the PM 62 height, l, the specific size of the gap g may be optimized to operate the PM 62 material at its most efficient $(B-H)_{max}$ operating point, or to accommodate manufacturer's stock thicknesses of the PM 62 material in order to reduce the cost of PM 62 and/or mechanical assembly.

The total height, L, is chosen sufficiently large to remove the PM 62 away from the first gap, G, such that the field gradients at or above the first gap, G, (where the MR element 68 and document are located) are determined primarily by the pole piece 64,66 geometry, and not significantly influenced directly by stray fields from the PMS 62 itself. The sizes of g, G, l, and L are also chosen sufficiently large so that the MR sensing element 68 can be made to fit inside the volume of the pole pieces 64,66 gap region. Given the large gradients, $\partial H_y/\partial x$, of the transverse field, $H_y$, at the upper gap, the MR element 68 may include additional mechanical fixturing to allow fine adjustment along the x-direction 74 of the MR element 68 position, in order that the transverse field, $H_y$, at the site of the MR element 68 allows maintenance of the MR element 68 in a proper bias magnetization state.

The width, w, of the pole piece 66,64 is chosen to be as small as is mechanically convenient, while maintaining sufficiently low pole piece 66,64 reluctance for good efficiency, and avoidance of pole piece 66,64 saturation near the base of the pole pieces 66,64 adjacent to the PM 62. The trackwidth, W, is chosen with regard to the width of that portion of the document that is being magnetically detected. The approximately 45° taper at the outer corner of the pole pieces 62,64 significantly reduces the reverse field seen by a document either before or after passing over the MR element 68.

A specific design of magnetic assembly includes annealed, cold-rolled steel pole pieces 64,66, with a NdFeB permanent magnet 62 (remanence $B_r$=11 kG, coercivity $H_c$=15 kOe, and an essentially square M-H loop) with G=0.3", g=0.125" (NdFeB manufacturer's stock thickness), L=0.8", l=0.185", w=0.6", and W=3.0". This design provides a gap field of $H_G \approx 1200$ Oe, and a "document field" $\geq 800$ Oe for $\leq 0.08$" head-to-document spacing.

The hard axis bias field of magnetoresistive element 68 needs to be 15±2 Oersteds while the field from PM 62 and pole pieces 64,66 can be as large as 1000 Oersteds. Because of mechanical tolerance and stray field problems, the assembly of the components of magnetic assembly 60 to achieve optimum bias was found to be very difficult. According to the present invention, this problem is solved by providing an electrical conductor layer 80 adjacent to but electrically insulated from the MR element by insulating layer 82. Conductor layer 80 has conductive pads 84,86 with respective conductors 88,90 for conducting a compensating DC current through layer 80. The compensating DC current produces a hard axis bias field of 0.15 Oe/mA which is combined with the much larger bias field produced by PM 62.

Figure 4:
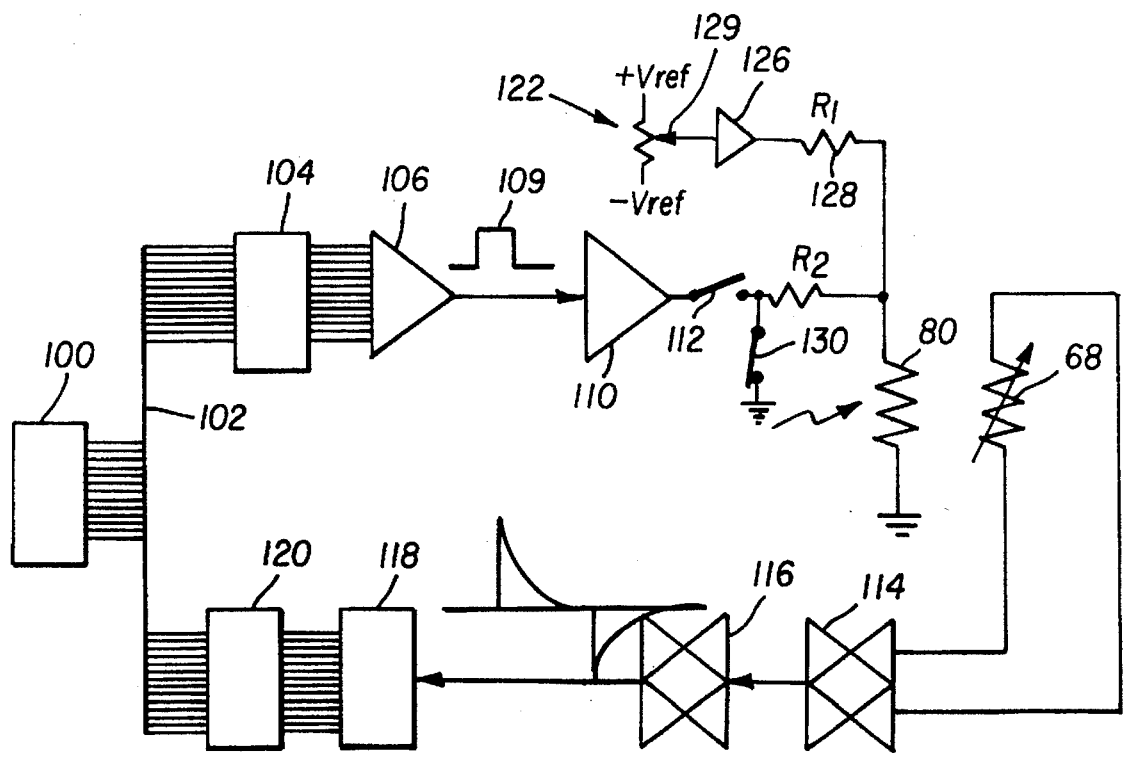
FIG. 4 is a partially schematic, partially block diagram useful in explaining the operation of the present invention.

After final assembly of magnetic assembly 60, the compensating bias field can be easily adjusted independently by passing an appropriate DC current through conductor layer 20. FIG. 4 is a block schematic diagram of a calibration circuit for carrying out such an adjustment. As shown, and as described in copending U.S. patent application Ser. No. 08/330,369 filed 28 Oct. 1994, during set-up of magnetic assembly 60, the CPU (central processing unit) 100 sends a digital signal over bus 102 to register 104. Register 104 applies the digital signal to digital-to-analog converter (DAC) 106 which converts it to an analog signal. The equivalent waveform is a step voltage 108 with an amplitude of 1.0 volts. The analog signal is buffered by buffer amplifier 110 and sent through conductor layer 80 through closed switch 112. The current in conductor layer 80 creates a magnetic field which MR element 68 senses. This signal is amplified by amplifier 114, filtered by filter 116, and converted to a digital signal by analog to digital convert (A/D) 118. The digital signal is sent to CPU by way of register 120 and bus 102.

According to the present invention, a variable source 122 of DC (direct current) passes a compensating current through conductive layer 80. Source 122 includes an adjustable potentiometer 124 connected between $+V_{REF}$ and $-V_{REF}$, a buffer amplifier 126, and resistor 128. During set-up, switch 130 is open, switch 112 is closed, and potentiometer 122 is adjusted to give maximum signal. During operation of MR element 68, switch 130 is closed, switch 112 is open, and DC source 122 supplies a compensating DC current through conductor layer 80.

Advantages

The present invention provides for an easily constructed, permanent magnet magnetizing fixture which provides a high magnetizing field and requires little external power, and which, with practical mechanical tolerances for document-to-head spacing, can partially or fully saturate the magnetic ink in a document as it is being read with a MR head for maximum sensitivity and reproducibility.

The invention has been described in detail herein with reference to the figures, however, it will be appreciated that variations and modifications are possible within the spirit and scope of the invention. For example, the permanent magnet can also be located adjacent to the MR sensing element.

What is claimed is:

1. A magnetic assembly for both magnetizing and detecting magnetic documents comprising:

a permanent magnet;

first and second magnetically soft, high permeability pole pieces shaped to form a tapered variable gap-size magnetic circuit with said permanent magnet, wherein said permanent magnet is located at a first gap between said first and second pole pieces;

a magnetoresistive (MR) sensing element which is located at or near the center of a second gap between said first and second pole pieces, wherein said second gap and said MR sensing element are proximate to a magnetic document to be sensed by said MR sensing element; and wherein said magnetic field at said MR sensing element maintains said MR element in a proper magnetic bias state for achieving adequate sensitivity for detecting magnetic fields emanating from a magnetic document to be sensed, said magnetic field also magnetizes said object to be detected;

an electrical conductor which is adjacent to but electrically insulated from said MR element; and a variable source of direct current for passing direct current through said electrical conductor for generating a bias field in said MR element which is combined with said bias field generated by said permanent magnet, wherein said bias field generated by said permanent magnet is substantially larger than the bias field generated by said direct current.

2. The magnetic assembly of claim 1 wherein said first and second pole pieces have inner and outer corners and wherein at least one outer corner of said first and second pole pieces over which a sensed magnetic document passes last in time, is relieved so as to significantly reduce, at that location, the strength of the component of magnetic field that is substantially opposite in direction to that produced at or near the center of said second gap between said first and second pole pieces.

3. The magnetic assembly of claim 1 wherein said MR sensing element is adjustably mounted within said second gap for optimizing the sensitivity of said MR sensing element.

4. The magnetic assembly of claim 1, wherein said MR sensing element comprises a nickel iron (NiFe) thin film layer.

5. The magnetic assembly of claim 1, wherein said permanent magnet comprises a NdFeB magnetic material.

6. The magnetic assembly of claim 1, wherein said pole pieces comprise annealed, cold-rolled steel.

* * * * *